(12) United States Patent
Gaumon et al.

(10) Patent No.: US 9,634,468 B2
(45) Date of Patent: Apr. 25, 2017

(54) SWITCHGEAR CABINET INCLUDING ELECTRICAL CONNECTION CLAMPING DEVICE

(71) Applicant: Semikron Elektronik GmbH & Co., KG, Nürnberg (DE)

(72) Inventors: Aurélien Gaumon, Paris (FR); Yann Lissilour, Paris (FR); Sébastien Touzard, Chàteau-sur-epte (FR)

(73) Assignee: Semikron Elekronik GmbH & Co., KG, Nürnberg (DE)

( * ) Notice: Subject to any disclaimer, the term of this patent is extended or adjusted under 35 U.S.C. 154(b) by 59 days.

(21) Appl. No.: 14/833,085

(22) Filed: Aug. 22, 2015

(65) Prior Publication Data
US 2016/0285245 A1 Sep. 29, 2016

(30) Foreign Application Priority Data

Aug. 12, 2014 (EP) ..................................... 14180682

(51) Int. Cl.
*H02B 1/30* (2006.01)
*H05K 7/14* (2006.01)

(52) U.S. Cl.
CPC ............. *H02B 1/30* (2013.01); *H05K 7/1432* (2013.01)

(58) Field of Classification Search
CPC ... H02B 1/30; H02B 1/32–1/36; H02B 11/04; H02B 11/12; H05K 7/1432

(Continued)

(56) References Cited

U.S. PATENT DOCUMENTS

| 4,772,999 | A | * | 9/1988 | Fiorina | .................. | H02J 9/062 361/709 |
| 7,667,952 | B2 | | 2/2010 | Allain | | |

(Continued)

FOREIGN PATENT DOCUMENTS

DE   197 11 016 A1   11/1997
EP   2 325 990 A2    5/2011

(Continued)

OTHER PUBLICATIONS

EPO Search Report in corresponding case, Mar. 4, 2015.

*Primary Examiner* — Zachary M Pape
(74) *Attorney, Agent, or Firm* — The Law Offices of Roger S. Thompson (57) ABSTRACT

A switchgear cabinet comprising a cabinet frame, first and second current converter devices, and an electrical connection clamping device. The first current converter device has first DC voltage positive and negative potential connection elements. The second current converter device has second DC voltage positive and negative potential connection elements. The electrical connection clamping device has an electrically conductive first clamping element and an electrically conductive second clamping element which is electrically insulated from the electrically conductive first clamping element, and a pressure-generating device which generates a pressure that pushes the second clamping element towards the first clamping element. The first clamping element is mechanically connected to the cabinet frame by an electrically non-conductive insulation body such that the first clamping element is electrically insulated from the cabinet frame. The invention provides a switchgear cabinet for housing current converter devices, wherein the current converter devices can be replaced quickly and easily.

12 Claims, 7 Drawing Sheets

(58) Field of Classification Search
USPC .......................................................... 361/605
See application file for complete search history.

(56) References Cited

U.S. PATENT DOCUMENTS

| 8,363,387 B2* | 1/2013 | Vanhyfte | H05K 7/1432 |
| | | | 361/608 |
| 2014/0192455 A1* | 7/2014 | Yoshida | H02M 7/003 |
| | | | 361/605 |

FOREIGN PATENT DOCUMENTS

| EP | 2 325 990 A3 | 5/2011 |
| WO | WO 2006053995 | 5/2006 |

* cited by examiner

SWITCHGEAR CABINET INCLUDING ELECTRICAL CONNECTION CLAMPING DEVICE

BACKGROUND OF THE INVENTION

1. Field of the Invention

The invention is directed to a switchgear cabinet for housing current converter devices, wherein the current converter devices can be replaced quickly and easily.

2. Description of the Related Art

Current converter devices, such as, for example, inverters, rectifiers or converters, are generally mounted in a switchgear cabinet. In this case, the DC voltage potential connection elements, which carry a DC voltage which is inverted, for example, into an AC voltage by the current converter devices, often have to be electrically conductively connected to one another in the switchgear cabinet. The current converter devices are often electrically conductively connected to a common intermediate circuit capacitor by means of their DC voltage potential connection elements.

When a fault occurs in one of the current converter devices of the switchgear cabinet, it is then necessary to replace the faulty current converter device of the switchgear cabinet in question. The aim here is to provide a switchgear cabinet in which the replacement process may be carried out quickly and simply.

European Patent No. 1 815 486 B1 discloses a connecting system between capacitor banks which are connected to an electrical circuit.

SUMMARY OF THE INVENTION

It is an object of the invention is to provide an improved switchgear cabinet in which the current converter devices can be replaced quickly and simply.

This object is achieved by a switchgear cabinet comprising: a cabinet frame; first and second current converter devices arranged in the switchgear cabinet and supported by the cabinet frame; and an electrical connection clamping device; wherein the first current converter device has first power semiconductor components and, for electrical connection of the first current converter device, a first DC voltage positive potential connection element and a first DC voltage negative potential connection element; wherein an electrically non-conductive first insulation element is arranged between the first DC voltage positive potential connection element and the first DC voltage negative potential connection element; wherein the second current converter device has second power semiconductor components and, for electrical connection of the second current converter device, a second DC voltage positive potential connection element and a second DC voltage negative potential connection element; wherein an electrically non-conductive second insulation element is arranged between the second DC voltage positive potential connection element and the second DC voltage negative potential connection element; wherein the electrical connection clamping device has an electrically conductive first clamping element and an electrically conductive second clamping element, which is arranged such that the electrically conductive second clamping element is electrically insulated from the electrically conductive first clamping element, and a pressure-generating device for generating a pressure which pushes the electrically conductive second clamping element toward the electrically conductive first clamping element; wherein the pressure-generating device pushes the second electrically conductive clamping element against the first and second DC voltage positive potential connection elements and, by means of the first DC voltage positive potential connection element and the first insulation element, pushes the first DC voltage negative potential connection element against the electrically conductive first clamping element and, by means of the second DC voltage positive potential connection element and the second insulation element, pushes the second DC voltage negative potential connection element against the electrically conductive first clamping element; and wherein the first electrically conductive clamping element is mechanically connected to the cabinet frame by an electrically non-conductive insulation body such that the electrically conductive first clamping element is electrically insulated from the cabinet frame.

It has proven advantageous when the first current converter device has a first DC voltage rail arrangement which has an electrically conductive first sheet metal element and an electrically conductive second sheet metal element which is arranged such that it is electrically insulated from the first sheet metal element, wherein the first DC voltage positive potential connection element is integrally formed with the first sheet metal element of the first DC voltage rail arrangement, and the first DC voltage negative potential connection element is integrally formed with the second sheet metal element of the first DC voltage rail arrangement, wherein the second current converter device has a second DC voltage rail arrangement which has an electrically conductive first sheet metal element and an electrically conductive second sheet metal element which is arranged such that it is electrically insulated from the first sheet metal element, wherein the second DC voltage positive potential connection element is integrally formed with the first sheet metal element of the second DC voltage rail arrangement, and the second DC voltage negative potential connection element is integrally formed with the second sheet metal element of the second DC voltage rail arrangement. A particularly simple and compact design of the DC voltage potential connection elements is achieved as a result.

It has further proven advantageous when the electrically conductive first clamping element is mechanically connected to the cabinet frame by the electrically non-conductive insulation body such that it is electrically insulated from the cabinet frame by the electrically conductive first clamping element being connected to the electrically non-conductive insulation body via a first screw connection, and the electrically non-conductive insulation body being connected to the cabinet frame via a second screw connection.

It has further proven advantageous when the pressure-generating device for generating the pressure has a first screw which mechanically connects the first and second clamping elements to one another, wherein the first screw is arranged such that it is electrically insulated from at least one of the first and second clamping elements. A pressure-generating device of particularly simple construction is created as a result.

In this connection, it has proven advantageous that, if the first screw is arranged such that it is electrically insulated from the first clamping element, an electrically non-conductive hollow insulation body, which is associated with the first screw and through which the first screw runs, is arranged between the first screw and the first clamping element, and that, if the first screw is arranged such that it is electrically insulated from the second clamping element, an electrically non-conductive hollow insulation body, which is associated with the first screw and through which the first screw runs, is arranged between the first screw and the second clamping element. An arrangement of the first and second clamping element such that they are electrically insulated from one another is achieved in a particularly simple manner as a result.

It has further proven advantageous when the first clamping element has first convex portions which project toward the second clamping element, and the second clamping element has second convex portions which project toward the first clamping element. A reliable electrical contact connection of the first and second clamping elements to the DC voltage potential connection elements is achieved as a result.

It has further proven advantageous when the first and second convex portions are provided with fluting on their surfaces. A particularly reliable electrical contact connection of the first and second clamping elements to the DC voltage potential connection elements is achieved as a result.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
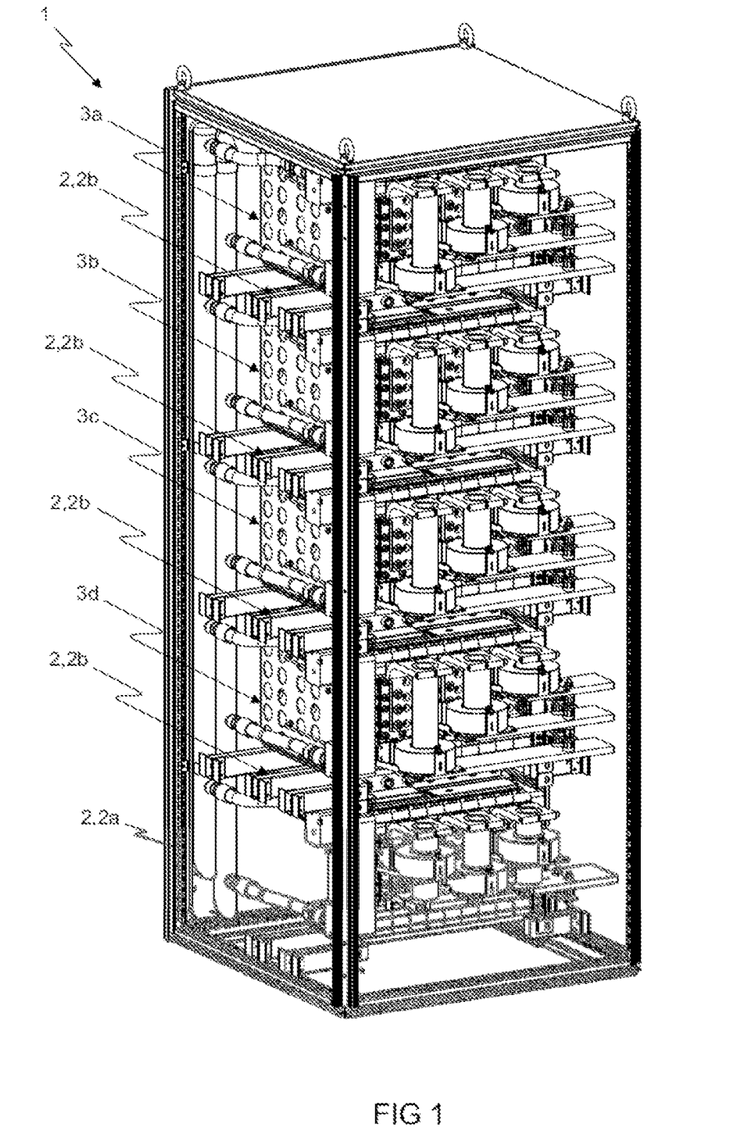
FIG. 1 shows a shows a perspective front view of the inventive switchgear cabinet.
Figure 2:
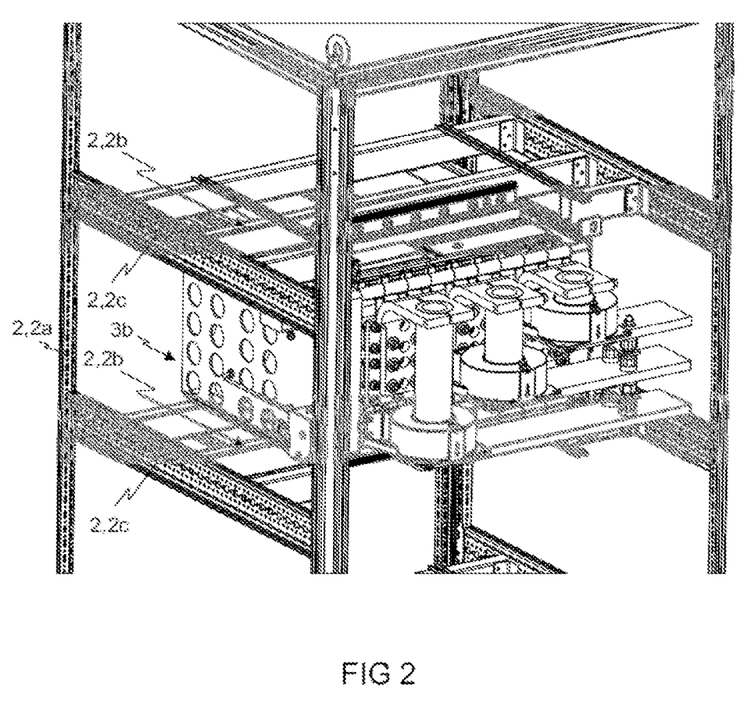
FIG. 2 shows a perspective front view of a current converter device which is installed in the inventive switchgear cabinet.

FIG. 1 shows a perspective front view of an inventive switchgear cabinet 1. Switchgear cabinet 1 has a cabinet frame 2 and first, second, third and fourth current converter devices 3a, 3b, 3c and 3d arranged in switchgear cabinet 1. Within the scope of the exemplary embodiment, current converter devices 3a, 3b, 3c and 3d are in the form of inverters which invert a DC voltage into a three-phase AC voltage. Current converter devices 3a, 3b, 3c and 3d can, for example, also be in the form of rectifiers or converters or other types of current converter. First, second, third and fourth current converter devices 3a, 3b, 3c and 3d are supported by cabinet frame 2. Within the scope of the exemplary embodiment, cabinet frame 2 has a cabinet structure 2a, transverse struts 2c which are connected to cabinet structure 2a (see, FIG. 2) and supporting elements 2b which are connected to transverse struts 2c and support first, second, third and fourth current converter devices 3a, 3b, 3c and 3d, wherein transverse struts 2c are not illustrated in FIG. 1 and only second current converter device 3b is illustrated in FIG. 2 for reasons of clarity.

In the text which follows, the design of switchgear cabinet 1, in particular the design of current converter devices 3a, 3b, 3c and 3d and of the electrical DC voltage connections of current converter devices 3a, 3b, 3c and 3d will be explained using first and second current converter devices 3a and 3b, wherein the other current converter devices of switchgear cabinet 1 are designed in an analogous manner and electrically connected to one another within the scope of the exemplary embodiment. Switchgear cabinet 1 according to the invention has at least first and second current converter devices 3a and 3b.

Figure 3:
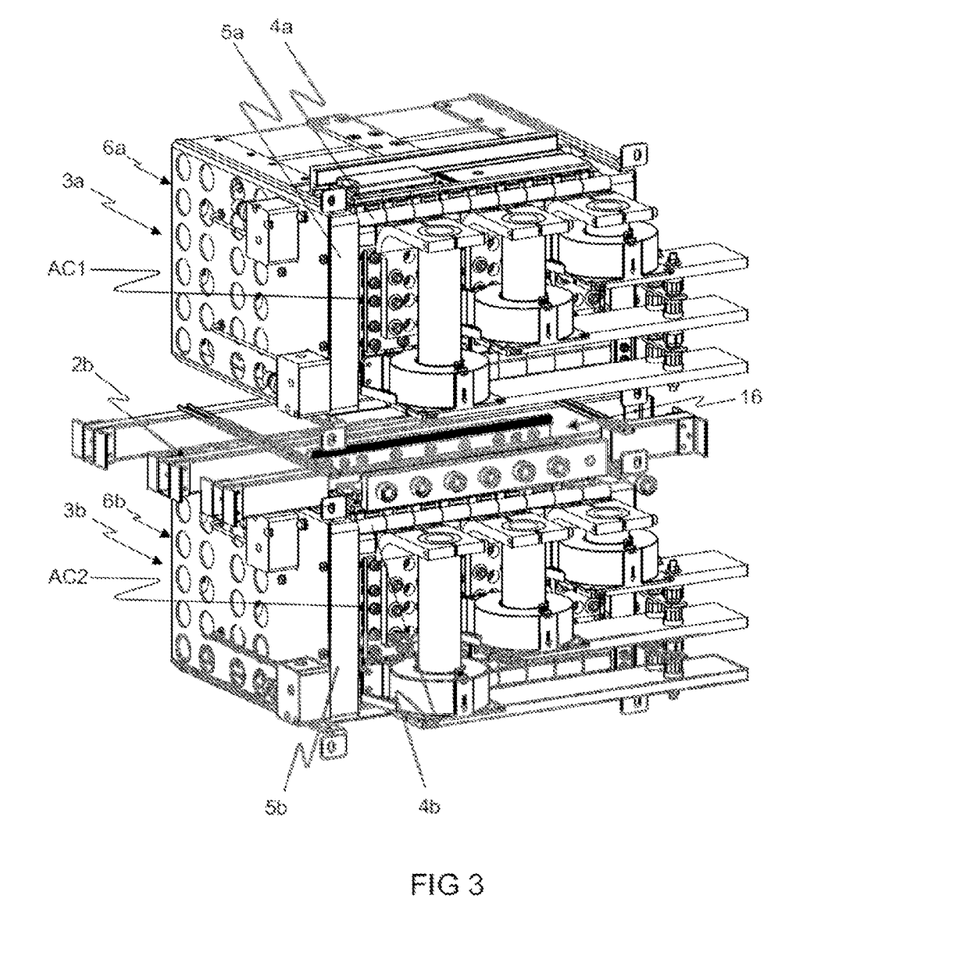
FIG. 3 shows a perspective front view of first and second current converter devices and a connection clamping device.
Figure 4:
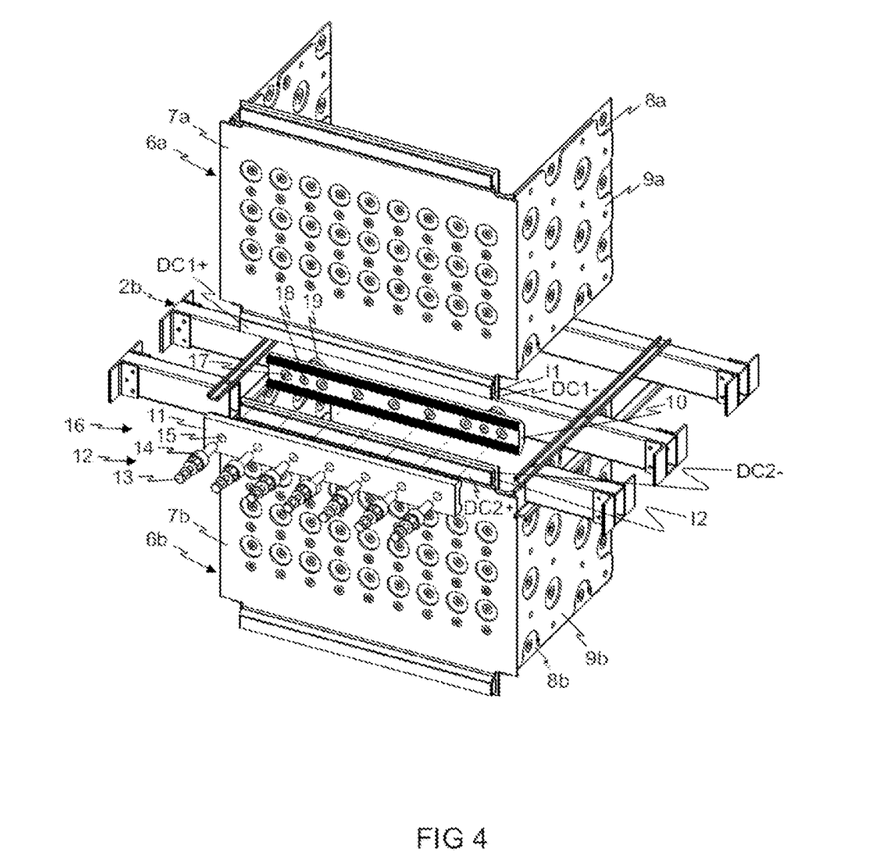
FIG. 4 shows a further perspective front view of a first DC voltage rail arrangement of the first current converter device and a second DC voltage rail arrangement of the second current converter device, which DC voltage rail arrangements are electrically contact-connected to one another by a connection clamping device.
Figure 5:
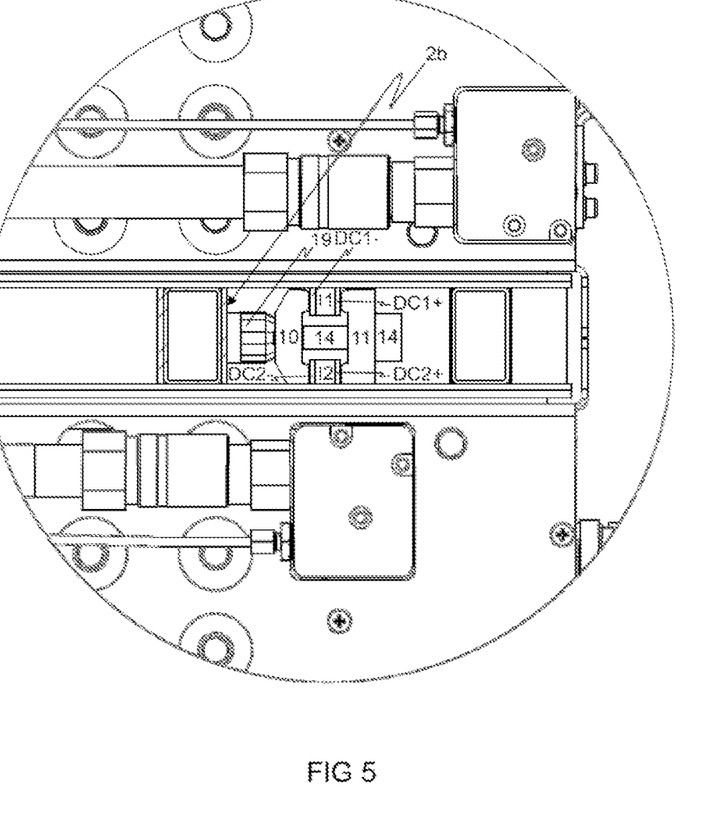
FIG. 5 shows a side view of the connection clamping device and the elements which are arranged in the vicinity of the connection clamping device in the switchgear cabinet.
Figure 6:
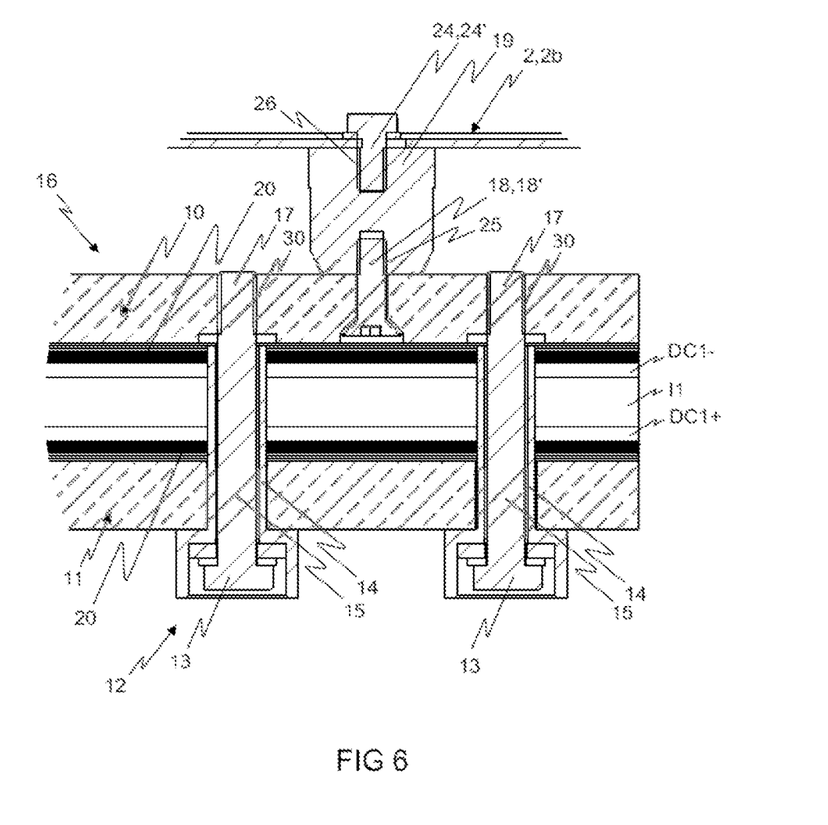
FIG. 6 shows a side view of the connection clamping device and the elements which are arranged in the vicinity of the connection clamping device in the switchgear cabinet.

FIG. 3 shows a perspective front view of first and second current converter devices 3a and 3b and an electrical connection clamping device 16. FIG. 4 shows a further perspective front view of a first DC voltage rail arrangement 6a of first current converter device 3a and a second DC voltage rail arrangement 6b of second current converter device 3b and of connection clamping device 16, wherein the other elements of first and second current converter devices 3a and 3b are not illustrated in FIG. 4. FIG. 5 shows a side view, and FIG. 6 shows a sectional view, of connection clamping device 16 and the elements which are arranged in the vicinity of connection clamping device 16 in switchgear cabinet 1.

Figure 8:
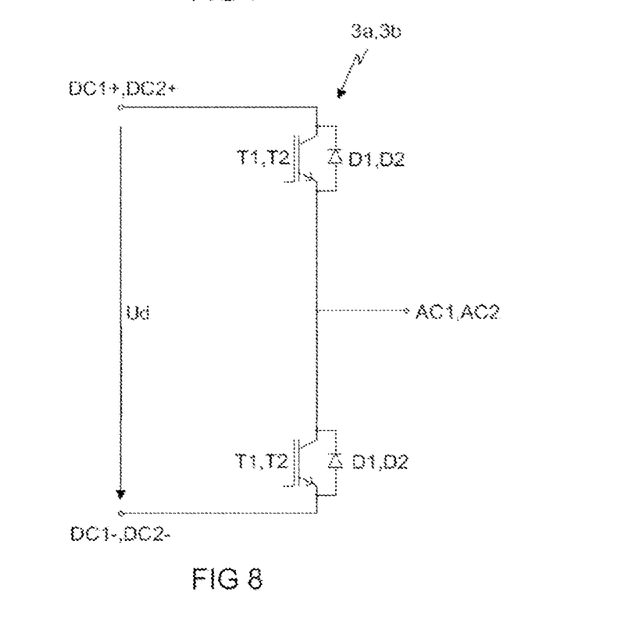
FIG. 8 shows an electrical circuit diagram of a module of a first or second current converter device.

Within the scope of the exemplary embodiment, first current converter device 3a has a plurality of first modules 4a which are arranged in a first current converter device structure 5a, and second current converter device 3b has a plurality of second modules 4b which are arranged in a second current converter device structure 5b. First modules 4a each have first power semiconductor components T1 and D1, and second modules 4b each have second power semiconductor components T2 and D2. FIG. 8 shows, by way of example, an electrical circuit diagram of a first or second module 4a or 4b which is electrically conductively connected to the respective DC voltage potential connection elements DC1+, DC1− or DC2+, DC2− of first or second power converter devices 3a or 3b. First modules 4a each have, at the output end, a first alternating voltage potential connection element AC1, and second modules 4b each have, at the output end, a second alternating voltage potential connection element AC2. Within the scope of the exemplary embodiment, the power semiconductor components of a respective module are electrically interconnected with one another to form a half-bridge circuit. In the exemplary embodiment, in each case three modules which are arranged next to one another in a common current converter device structure are connected electrically in parallel in this case.

In the case of the invention, the respective power semiconductor component is in each case preferably present in the form of a power semiconductor sub-switch or a power diode. The respective power semiconductor sub-switch is preferably present in the form of a transistor, such as an IGBT (Insulated Gate Bipolar Transistor) or a MOSFET (Metal Oxide Semiconductor Field Effect transistor) for example. Within the scope of the exemplary embodiment, the first and second power semiconductor elements are present in the form of IGBTs and power diodes.

First current converter device 3a has first power semiconductor components T1 and D1 and, for electrical connection of the first current converter device 3a, a first DC voltage positive potential connection element DC1+ and a first DC voltage negative potential connection element DC1−, wherein an electrically non-conductive first insulation element I1 is arranged between the first DC voltage positive potential connection element DC1+ and first DC voltage negative potential connection element DC1−. First DC voltage positive potential connection element DC1+ and first DC voltage negative potential connection element DC1− are generally electrically conductively connected to at least one of the first power semiconductor components. Second current converter device 3b has second power semiconductor components T2 and D2 and, for electrical connection of second current converter device 3b, has a second DC voltage positive potential connection element DC2+ and a second DC voltage negative potential connection element DC2−, wherein an electrically non-conductive second insulation element 12 is arranged between second DC voltage positive potential connection element DC2+ and second DC voltage negative potential connection element DC2−. Second DC voltage positive potential connection element DC2+ and second DC voltage negative potential connection element DC2− are generally electrically conductively connected to at least one of the second power semiconductor components.

During operation of switchgear cabinet 1, first and second DC voltage positive potential connection elements DC1+ and DC2+ have a positive electrical polarity, and first and second DC voltage negative potential connection elements DC1− and DC2− have a negative electrical polarity, wherein a DC voltage Ud is applied between first DC voltage positive potential connection element DC1+ and first DC voltage negative potential connection element DC1−, and between second DC voltage positive potential connection element DC2+ and second DC voltage negative potential connection element DC2−.

Within the scope of the exemplary embodiment, first current converter device 3a has a first DC voltage rail arrangement 6a which has an electrically conductive first sheet metal element 7a and an electrically conductive second sheet metal element 8a which is arranged such that it is electrically insulated from first sheet metal element 7a, wherein first DC voltage positive potential connection element DC1+ is preferably integrally formed with first sheet metal element 7a of first DC voltage rail arrangement 6a, and first DC voltage negative potential connection element DC1− is preferably integrally formed with second sheet metal element 8a of first DC voltage rail arrangement 6a. An electrically non-conductive first insulation layer 9a (for example a plastic film) is arranged between first and second sheet metal elements 7a and 8a of first DC voltage rail arrangement 6a. In addition to first insulation element I1, first insulation layer 9a can be arranged between first DC voltage positive potential connection element DC1+ and first DC voltage negative potential connection element DC1−.

Furthermore, within the scope of the exemplary embodiment, second current converter device 3b has a second DC voltage rail arrangement 6b which has an electrically conductive first sheet metal element 7b and an electrically conductive second sheet metal element 8b which is arranged such that it is electrically insulated from first sheet metal element 7b, wherein second DC voltage positive potential connection element DC2+ is preferably integrally formed with first sheet metal element 7b of second DC voltage rail arrangement 6b, and second DC voltage negative potential connection element DC2− is preferably integrally formed with second sheet metal element 8b of second DC voltage rail arrangement 6b. An electrically non-conductive second insulation layer 9b (for example a plastic film) is arranged between first and second sheet metal elements 7b and 8b of second DC voltage rail arrangement 6b. In addition to second insulation element 12, second insulation layer 9b can be arranged between second DC voltage positive potential connection element DC2+ and second DC voltage negative potential connection element DC2−.

In order to electrically connect first and second DC voltage positive potential connection elements DC1+ and DC2+, and first and second DC voltage negative potential connection elements DC1− and DC2−, to one another, switchgear cabinet 1 has electrical connection clamping device 16. Connection clamping device 16 has an electrically conductive first clamping element 10 and an electrically conductive second clamping element 11, which is arranged such that it is electrically insulated from first clamping element 10, and a pressure-generating device 12 which is designed to generate a pressure which pushes second clamping element 11 toward the first clamping element 10. Pressure-generating device 12 pushes second clamping element 11 against first and second DC voltage positive potential connection elements DC1+ and DC2+ and, by means of first DC voltage positive potential connection element DC1+ and first insulation element I1, pushes first DC voltage negative potential connection element DC1− against first clamping element 10 and, by means of second DC voltage positive potential connection element DC2+ and second insulation element 12, pushes second DC voltage negative potential connection element DC2− against first clamping element 10. As a result, first clamping element 10 is electrically contact-connected to first and second DC voltage negative potential connection elements DC1− and DC2−, and second clamping element 11 is electrically contact-connected to first and second DC voltage positive potential connection elements DC1+ and DC2+. First and second clamping elements 10 and 11 are preferably composed of copper. First and second clamping elements 10 and 11 also preferably have an elongate shape.

Pressure-generating device 12 preferably has, in order to generate the pressure, first screws 13 which mechanically connect first and second clamping elements 10 and 11 to one another, wherein first screws 13 are arranged such that they are electrically insulated from first or second clamping elements 10 or 11. In the exemplary embodiment, first screws 13 are arranged such that they are electrically insulated from second clamping element 11. It should be noted that, in the simplest case, also only one single first screw 13 can be provided.

If, as in the exemplary embodiment, first screws 13 are arranged such that they are electrically insulated from first clamping element 10, an electrically non-conductive hollow insulation body 14, which is associated with the respective first screw 13 through which the respective first screw 13 runs, is in each case arranged between first screws 13 and first clamping element 10. If first screws 13 are arranged such that they are electrically insulated from second clamping element 11, an electrically non-conductive hollow insulation body 14, which is associated with respective first screw 13 and through which the respective first screw 13 runs, is in each case arranged between first screws 13 and second clamping element 10.

First clamping element 10 preferably has first holes 17, and second clamping element 11 preferably has second holes 15, the wall of said holes being provided with an internal thread 30, wherein first screws 13 run through first holes 17 and are screwed into internal thread 30. It should be noted that, if there is only one single first screw 13, there can also only be one single first hole 17 and one single internal thread 30.

Figure 7:
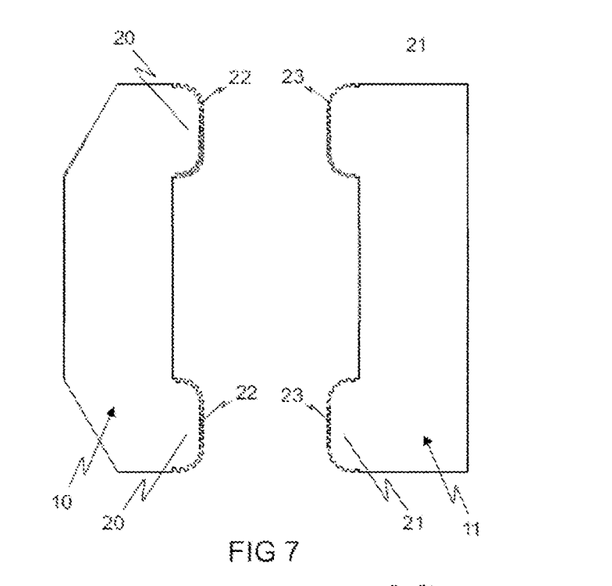
FIG. 7 shows a side view of first and second clamping elements of the connection clamping device.

First clamping element 10, as illustrated in FIG. 7 by way of example, preferably has first convex portions 20 which project toward second clamping element 11, and second clamping element 11 preferably has second convex portions 21 which project toward first clamping element 10. First convex portions 20 are preferably provided with a fluting 22 on their surfaces, and second convex portions 21 are preferably provided with a fluting 23 on their surfaces. A particularly reliable electrical contact-connection of the respective convex portion to the respective DC voltage potential connection element (DC1+, DC2+, DC1−, DC2−) is achieved as a result.

According to the invention, first clamping element 10 is mechanically connected to cabinet frame 2 by means of an electrically non-conductive insulation body 19 such that it is electrically insulated from cabinet frame 2. As a result, first or second current converter device 3a or 3b can be quickly and easily replaced since first clamping element 10 remains fixedly connected to cabinet frame 2 when first or second current converter device 3a or 3b is replaced, and therefore only second clamping element 11 has to be removed from connection clamping device 16 in order to replace first or second current converter device 3a or 3b. First or second current converter device 3a or 3b which is to be replaced can be removed toward the front face of switchgear cabinet 1, and then a new current converter device can be arranged in the place of the removed current converter device in switchgear cabinet 1. The new current converter device can then be easily electrically connected to the current converter device, which remained in switchgear cabinet 1, in respect of its DC voltage potential connection elements by second clamping element 11 being refitted and pressure-generating device 12 pushing second clamping element 11 toward first clamping element 10.

First clamping element 11 is preferably mechanically connected to cabinet frame 2 by electrically non-conductive insulation body 19 such that it is electrically insulated from cabinet frame 2 by first clamping element 10 being connected to insulation body 19 by a screw connection 18, and insulation body 19 being connected to cabinet frame 2 by means of a further screw connection 24 (see, FIG. 6). Within the scope of the exemplary embodiment, insulation body 19 has a first internal thread 25 on its side which faces first clamping element 10 for this purpose, wherein a second screw 18' which passes through first clamping element 10 is screwed into first internal thread 25, and has a second internal thread 26 on its side which faces the point of cabinet frame 2 at which insulation body 19 is connected to cabinet frame 2, wherein a third screw 24' which passes through cabinet frame 2 is screwed into second internal thread 26. In order to produce first and second internal threads 25 and 26, insulation body 19 can have holes into which the metal sleeves which are provided with an internal thread are inserted. The metal sleeves are not illustrated in FIG. 6 for reasons of clarity. Within the scope of the exemplary embodiment, two insulation bodies have been used for fastening the first clamping element to the cabinet frame, wherein it is also possible for even more than two insulation bodies to be used for this purpose or else for only one single insulation body to be used for this purpose.

Within the scope of the exemplary embodiment, that portion of insulation body 19 which produces the electrical insulation of insulation body 19 is composed of a polyester composite material comprising glass fibers.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A switchgear cabinet comprising:
    a cabinet frame;
    first and second current converter devices arranged in the switchgear cabinet and supported by said cabinet frame; and
    an electrical connection clamping device;
    wherein said first current converter device has first power semiconductor components and, for electrical connection of said first current converter device, a first DC voltage positive potential connection element and a first DC voltage negative potential connection element;
    wherein an electrically non-conductive first insulation element is arranged between said first DC voltage positive potential connection element and said first DC voltage negative potential connection element;
    wherein said second current converter device has second power semiconductor components and, for electrical connection of said second current converter device, a second DC voltage positive potential connection element and a second DC voltage negative potential connection element;
    wherein an electrically non-conductive second insulation element is arranged between said second DC voltage positive potential connection element and said second DC voltage negative potential connection element;
    wherein said electrical connection clamping device has an electrically conductive first clamping element and an electrically conductive second clamping element, which is arranged such that said electrically conductive second clamping element is electrically insulated from said electrically conductive first clamping element, and a pressure-generating device for generating a pressure which pushes said electrically conductive second clamping element toward said electrically conductive first clamping element;

wherein said pressure-generating device pushes said second electrically conductive clamping element against said first and second DC voltage positive potential connection elements and, by means of said first DC voltage positive potential connection element and said first insulation element, pushes said first DC voltage negative potential connection element against said electrically conductive first clamping element and, by means of said second DC voltage positive potential connection element and said second insulation element, pushes said second DC voltage negative potential connection element against said electrically conductive first clamping element; and wherein said first electrically conductive clamping element is mechanically connected to said cabinet frame by an electrically non-conductive insulation body such that said electrically conductive first clamping element is electrically insulated from said cabinet frame.

2. The switchgear cabinet of claim 1, wherein said first current converter device has a first DC voltage rail arrangement which has an electrically conductive first sheet metal element and an electrically conductive second sheet metal element which is arranged such that it is electrically insulated from said first sheet metal element of said first DC voltage rail arrangement;

wherein said first DC voltage positive potential connection element is integrally formed with said first sheet metal element of said first DC voltage rail arrangement, and said first DC voltage negative potential connection element is integrally formed with said second sheet metal element of said first DC voltage rail arrangement;

wherein said second current converter device has a second DC voltage rail arrangement which has an electrically conductive first sheet metal element and an electrically conductive second sheet metal element which is arranged such that it is electrically insulated from said first sheet metal element of said second DC voltage rail arrangement; and wherein said second DC voltage positive potential connection element is integrally formed with said first sheet metal element of said second DC voltage rail arrangement, and said second DC voltage negative potential connection element is integrally formed with said second sheet metal element of said second DC voltage rail arrangement.

3. The switchgear cabinet of claim 2, wherein said pressure-generating device includes, in order to generate said pressure, a first screw which mechanically connects said electrically conductive first and second clamping elements to one another; and wherein said first screw is arranged such that it is electrically insulated from at least one of said electrically conductive first and second clamping elements.

4. The switchgear cabinet of claim 2, wherein said electrically conductive first clamping element is mechanically connected to said cabinet frame by said electrically non-conductive insulation body such that it is electrically insulated from said cabinet frame by said electrically conductive first clamping element being connected to said electrically non-conductive insulation body via a first screw connection, and said electrically non-conductive insulation body being connected to said cabinet frame via a second screw connection.

5. The switchgear cabinet of claim 4, wherein said pressure-generating device includes, in order to generate said pressure, a first screw which mechanically connects said electrically conductive first and second clamping elements to one another; and wherein said first screw is arranged such that it is electrically insulated from at least one of said electrically conductive first and said second clamping elements.

6. The switchgear cabinet of claim 1, wherein said electrically conductive first clamping element is mechanically connected to said cabinet frame by said electrically non-conductive insulation body such that it is electrically insulated from said cabinet frame by said electrically conductive first clamping element being connected to said electrically non-conductive insulation body via a first screw connection, and said electrically non-conductive insulation body being connected to said cabinet frame via a second screw connection.

7. The switchgear cabinet of claim 6, wherein said pressure-generating device includes, in order to generate said pressure, a first screw which mechanically connects said electrically conductive first and second clamping elements to one another; and wherein said first screw is arranged such that it is electrically insulated from at least one of said electrically conductive first and said second clamping elements.

8. The switchgear cabinet of claim 1, wherein said pressure-generating device includes, in order to generate said pressure, a first screw which mechanically connects said electrically conductive first and second clamping elements to one another; and wherein said first screw is arranged such that it is electrically insulated from at least one of said electrically conductive first and said second clamping elements.

9. The switchgear cabinet of claim 8, wherein, said first screw is arranged such that it is electrically insulated from said electrically conductive first clamping element; and wherein the switchgear cabinet further comprises an electrically non-conductive hollow insulation body, which is associated with said first screw and through which said first screw runs, and which is disposed between said first screw and said electrically conductive first clamping element.

10. The switchgear cabinet of claim 8, wherein, said first screw is arranged such that it is electrically insulated from said electrically conductive second clamping element; and wherein the switchgear cabinet further comprises an electrically non-conductive hollow insulation body, which is associated with said first screw and through which said first screw runs, and which is disposed between said first screw and said electrically conductive second clamping element.

11. The switchgear cabinet of claim 1, wherein said first electrically conductive clamping element has first convex portions which project toward said electrically conductive second clamping element, and said electrically conductive second clamping element has second convex portions which project toward said electrically conductive first clamping element.

12. The switchgear cabinet of claim 11, wherein said first and second convex portions each includes fluting on their respective surfaces.

* * * * *